United States Patent [19]

Omori et al.

[11] 3,916,293

[45] Oct. 28, 1975

[54] SIGNAL CLIPPING CIRCUIT UTILIZING A P-N JUNCTION DEVICE

[75] Inventors: Shoji Omori, Tokyo; Kenji Ito, Yokohama; Yoshio Ishigaki, Tokyo, all of Japan

[73] Assignee: Sony Corporation, Tokyo, Japan

[22] Filed: Dec. 3, 1974

[21] Appl. No.: 529,089

[30] Foreign Application Priority Data

Dec. 7, 1973 Japan .............................. 48-139119

[52] U.S. Cl. ...................... 323/9; 307/237; 328/172

[51] Int. Cl.$^2$ ............................................ G05F 3/00

[58] Field of Search ........... 323/4, 9, 22 T; 307/237; 328/172

[56] References Cited

UNITED STATES PATENTS

| | | | |
|---|---|---|---|
| 3,255,402 | 6/1966 | Vollnhals | 323/9 |
| 3,761,741 | 9/1973 | Hoeft | 328/172 |
| 3,763,382 | 10/1973 | Horichi et al. | 307/237 |
| 3,829.717 | 8/1974 | Harrison | 307/237 |

*Primary Examiner*—Gerald Goldberg

*Attorney, Agent, or Firm*—Hill, Gross, Simpson, Van Santen, Steadman, Chiara & Simpson

[57] ABSTRACT

A clipper circuit utilizing a P-N junction device for clipping an input signal thereto in which a clipping level controller is provided for detecting a voltage across a P-N junction of the P-N junction device and controlling the clipping level in response to the detected voltage thereby to compensate for the nonlinear voltage-current characteristic of the P-N junction device.

7 Claims, 5 Drawing Figures

SIGNAL CLIPPING CIRCUIT UTILIZING A P-N JUNCTION DEVICE

BACKGROUND OF THE INVENTION

1. Field of the Invention

This invention generally relates to circuits for clipping an input signal at a predetermined level, and more particularly is directed to improvements in signal clipping circuits utilizing a P-N junction device to clip the input signal.

2. Description of the Prior Art

Generally, there has been proposed a circuit for deriving as an output signal only portions of input signals the amplitude of which exceeds a predetermined level. Such a circuit is well known as a so-called clipper circuit for clipping a signal at a predetermined clipping level and usually composed of a P-N junction device, typically a diode, connected to an input signal source, a load connected to the P-N junction device for providing an output and a voltage source provided for the P-N junction to determine the clipping level. In this circuit, the signal clipping is achieved by utilizing changes in conductivity of the P-N junction device. That is, when the amplitude of the input signal is less than the clipping level determined by the voltage source the P-N junction device is in the nonconductive condition, so that no output signal is provided. While, when the amplitude of the input signal goes over the clipping level the P-N junction is turned to the conductive condition and the portions of input signal amplitude exceeding the clipping level are derived.

In such circuits as mentioned above, since the conductivity of the P-N junction is nonlinear in the voltage-current characteristic, the relation between the clipped output signal and the input signal is also a nonlinear characteristic and this results in a disadvantage that the output signal has a distorted waveform. Further, it is required for some reasons to change a characteristic of the relation between the clipped output signal and the input signal. It is, however, very hard for the previously proposed clipper circuits to change their characteristics of the relation between the clipped output and the input signals.

SUMMARY OF THE INVENTION

It is an object of the present invention to provide an improved clipper circuit utilizing a P-N junction device from which disadvantages inherent in the prior art circuits are eliminated.

Another object of the present invention is to provide an improved clipper circuit utilizing a P-N junction device in which nonlinearity in the inputoutput characteristic caused by the nonlinear voltage-current characteristic of the P-N junction device is compensated.

Further, another object of the present invention is to provide an improved clipper circuit utilizing a P-N junction device in which the input-output characteristic can be easily changed.

Other objects, features and advantages of the present invention will become apparent from the following description taken in conjunction with the accompanying drawings.

DESCRIPTION OF THE PREFERRED EMBODIMENTS

Figure 1:
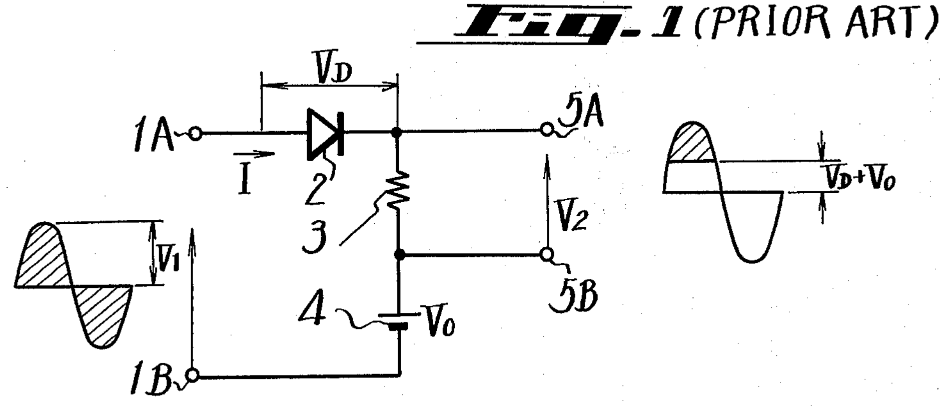
FIG. 1 (PRIOR ART)
FIG. 1 is a schematic circuit diagram showing a conventional clipper circuit.

One example of a prior art clipper circuit utilizing a P-N junction device is fundamentally constructed as shown in FIG. 1. That is, between input terminals 1A and 1B there are connected a diode 2 for clipping, a load resistor 3 and bias voltage source 4 for setting a clipping level in series with one another, and output terminals 5A and 5B are led out from the both ends of the load resister 3.

If it is assumed that a voltage across the diode 2 is taken as $V_D$ when the diode 2 is conductive and the voltage of the voltage source 4 as $V_O$, the diode 2 becomes conductive when an input voltage $V_1$ satisfies the condition $V_1 \geqq V_D + V_O$. At that condition, a current flows in the load resistor 3 with the result that an output voltage $V_2$ is obtained across the output terminals 5A and 5B (refer to the hatched portion in FIG. 1).

In the above described prior art clipper circuit, the following relationship is established.

$$V_2 = V_1 - V_D - V_O$$

Where a current I passing through the diode 2 is expressed as follows $$I = I_S \left\{ \exp \left( \frac{q}{kT} V_D \right) - 1 \right\}$$

where $I_S$ is the reverse saturation current, $k$ is the Boltzman's constant, $T$ is the Kelvin temperature and $q$ is the electronic charge, so that the relationship between the input voltage $V_1$ and the output voltage $V_2$ becomes nonlinear within the condition of $V_1 \geqq V_O$.

However, in general it is often required that the $V_1$ - $V_2$ characteristic is linear and also that the $V_1$ - $V_2$ characteristic can be made variable. Such requests, however, can not be satisfied by the above prior art clipper circuit.

Figure 2:
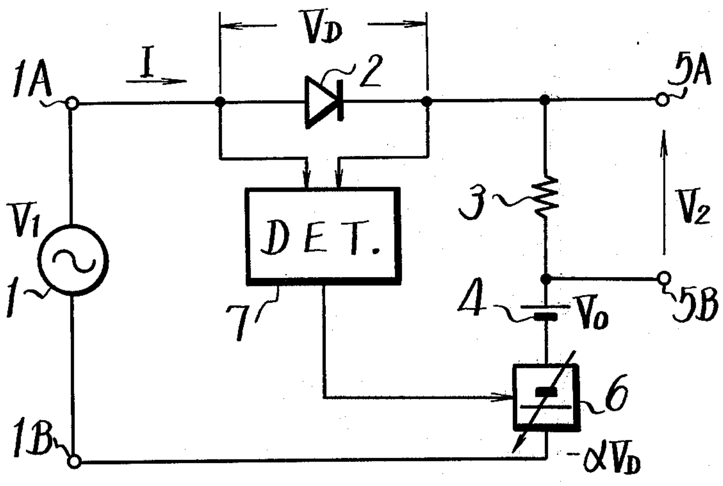
FIG. 2 is a schematic circuit diagram showing a fundamental connection of clipper circuits according to the present invention.

A clipper circuit according to the present invention will be now described. FIG. 2 shows the fundamental circuit construction of the clipper circuit according to the invention. In FIG. 2, reference numeral 1 designates an input signal source and 1A, 1B, 2, 3 and 4 designate input terminals, a diode for clipping, a load resistor and a bias voltage source for setting a clipping level, respectively, as in the case of FIG. 1. In the invention, a variable bias voltage source 6 is connected in series to the voltage source 4 or signal source 1 and a detecting circuit 7 is connected in parallel to the diode 2 for detecting a voltage across the diode 2. An output from the detecting circuit 7 is applied to the variable bias voltage source 6 to control the same. Output terminals 5A and 5B are led out from the both ends of the resistor 3 as in the case of FIG. 1.

Assuming that the voltage of the variable bias voltage source 6 is taken as $\alpha V_D$ (where $\alpha$ is a constant) and the other symbols $V_O$, $V_1$, $V_2$ and $V_D$ represent the same as in the case of FIG. 1, the following equations are established in the clipper circuit of the invention shown in FIG. 2.

$$V_2 = V_1 - (1 - \alpha)\, V_D - V_O$$

$$I = I_S \left\{ \exp\left( \frac{q}{kT} V_D \right) - 1 \right\} .$$

Figure 3:
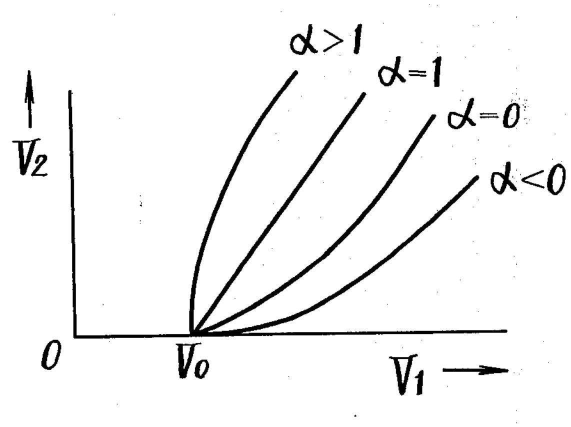
FIG. 3 is a schematic diagram used for the explanation of the present invention.

Accordingly, the $V_1$ - $V_2$ characteristic can be shown in FIG. 3 where $\alpha$ is taken as a parameter. In FIG. 3, a condition $\alpha = 0$ represents the case of FIG. 1 which becomes nonlinear in the vicinity of the clipping level. If $\alpha = 1$, $V_2$ becomes to $V_1 - V_0$($V_2 = V_1 - V_0$) and hence the $V_1 - V_2$ characteristic is reverse to that of FIG. 1. Accordingly, in the circuit of FIG. 2, if the variable bias voltage source 6 is controlled with the output from the detecting circuit 7 in such a manner that the voltage of the variable bias voltage source 6 becomes to a voltage $\alpha V_D$ which is in proportion to the voltage $V_D$ across the diode 2, the circuit is made to be a clipper circuit whose $V_1 - V_2$ characteristic is controlled as shown in FIG. 3. Especially, if the circuit is controlled as with $\alpha = 1$ or the voltage of the variable bias voltage source 6 is made equal to the voltage $V_D$ across the diode 2, the $V_1 - V_2$ characteristic can be made linear.

In conclusion, the invention the clipping level which is determined by the voltage $V_O$ of the voltage source 4 and the voltage of the variable bias voltage source 6 is varied in response to the voltage $V_D$ across the diode 2 to obtain the predetermined input-output characteristic.

Figure 4:
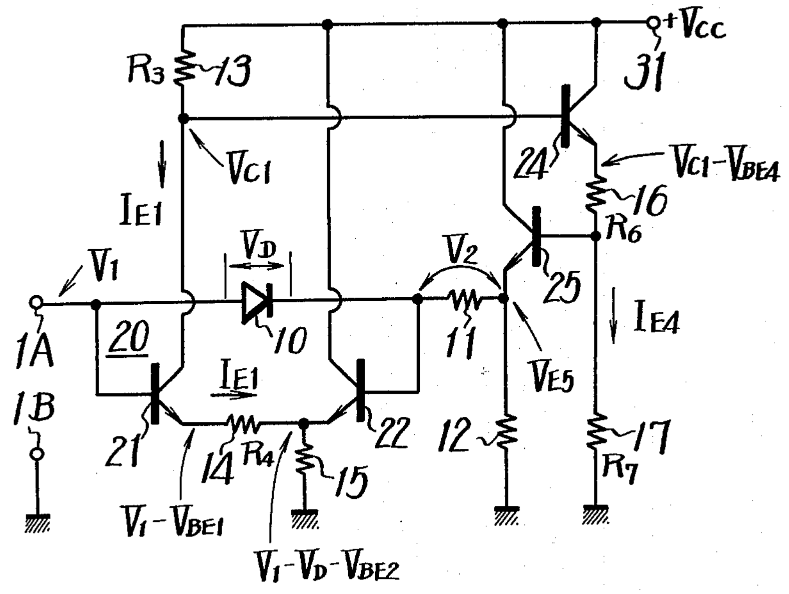
FIG. 4 is a circuit diagram showing one embodiment of clipper circuits according to the present invention.

FIG. 4 is a connection diagram showing a practical embodiment of the clipper circuit according to the invention. In the figure, an input terminal 1A is connected through a series connection of a diode 10, a load resistor 11 and a resistor 12 to the ground. A differential amplifier 20 is provided for detecting a voltage $V_D$ across the diode 10. The differential amplifier 20 consists of a transistor 21 whose base is connected to the input terminal 1A and whose collector is connected through a resistor 13 to a voltage source terminal 31 of $+V_{cc}$ and a transistor 22 whose base is connected to the connection point between the diode 10 and the resistor 11, whose collector is connected to the voltage source terminal 31 and whose emitter is connected through a resistor 14 to the emitter of the transistor 21 and through a resistor 15 to the ground.

In order to control the clipping level of the clipper circuit with the detected output of the differential amplifier 20, transistors 24 and 25 are provided. In detail, the collector of the transistor 21 is connected to the base of the transistor 24, whose collector is connected to the voltage source terminal 31 and whose emitter is grounded through a series connection of resistors 16 and 17; the base of the transistor 25 is connected to the connection point between the resistors 16 and 17; the collector of the transistor 25 is connected to the voltage source terminal 31; and the emitter of the transistor 25 is connected to the connection point between the resistors 11 and 12, respectively.

In the circuit described as above, the circuit portion formed of the transistors 24 and 25 acts as the bias voltage source 4 and variable bias voltage source 6 for clipping in the fundamental circuit shown in FIG. 2 to determine the clipping level with the voltage across the resistor 12. Thus, a clipped output signal can be obtained across the resistor 11. In this case, the voltage $V_D$ across the diode 10 is detected by the differential amplifier 20, and voltage corresponding to the detected voltage $V_D$ is applied through the transistors 24 and 25 of emitter-follower configuration to the resistor 12. As a result, if the resistance values of the resistors 13, 14, 16 and 17 are selected suitably, a clipped output with an arbitrary characteristic which corresponds to one of those shown in FIG. 3 can be obtained across the resistor 11.

If it is assumed that the resistance values of the resistors 13, 14, 16 and 17 are taken as $R_3$, $R_4$, $R_6$ and $R_7$ and the voltages at and across the respective parts and the currents following through the respective parts are taken as shown in FIG. 4, and base currents of the transistors are neglected, the following expression can be established.

$$I_{E1} = \left\{ (V_1 - V_{BE1}) - (V_1 - V_D - V_{BE2}) \right\} / R_4$$
$$= V_D / R_4 \qquad (\because V_{BE1} = V_{BE2})$$

Thus, the following expression is obtained.

$$V_{C1} = V_{CC} - I_{E1} R_3$$
$$= V_{CC} - \frac{R3}{R4} V_D$$

Then, the current $I_{E4}$ is expressed as follows.

$$I_{E4} = (V_{C1} - V_{BE4}) / (R_6 + R_7)$$
$$= \left( V_{CC} - \frac{R3}{R4} V_D - V_{BE4} \right) / (R_6 + R_7)$$

Thus, the voltage $V_{E5}$ can be expressed as follows.

$$V_{E5} = I_{E4} \cdot R_7 - V_{BE5}$$
$$= \left( V_{CC} - \frac{R3}{R4} V_D - V_{BE4} \right) R_7 / (R_6 + R_7) - V_{BE5}$$
$$= - V_D \cdot R_3 \cdot R_7 / R_4 (R_6 + R_7)$$
$$+ (V_{CC} - V_{BE4})\, R_7 / (R_6 + R_7) - V_{BE5}$$

Thus, the output voltage $V_2$ is expressed as follows.

$$V_2 = V_1 - V_D - V_{E5}$$
$$= V_1 - \{ 1 - R_3 R_7 / R_4 (R_6 + R_7) \} V_D$$
$$- (V_{CC} - V_{BE4})\, R_7 / (R_6 + R_7) - V_{BE5}$$

Since the transistors 24 and 25 are operated in their active region, the voltages $V_{BE4}$ and $V_{BE5}$ are constant for feeble variation of their collector currents, and since the diode 10 is used from its nonconductive state to its conductive state, the voltage $V_D$ across the diode 10 becomes to a variable. Accordingly, if a change of the input voltage $V_1$ is taken as $\Delta V_1$ and that of the output voltage $V_2$ as $\Delta V_2$, the following relationship exists.

$$\Delta V_2 = \Delta V_1 - (1 - \alpha)\, V_D$$
$$\alpha = R_3 \cdot R_7 / R_4 (R_6 + R_7)$$

Therefore, it may be understood that if the resistance values $R_3$, $R_4$, $R_6$ and $R_7$ of the resistors 13, 14, 16 and 17 are selected suitably, any one of the clipping characteristics shown in FIG. 3 can be obtained. By way of example, if the resistance values are selected to satisfy $\alpha = 1$, $\Delta V_2$ becomes equal to $\Delta V_1$ or $\Delta V_2 = \Delta V_1$ Thus, the input to output characteristic which does not depend upon the characteristic of the diode 10 can be obtained.

With the invention, an arbitrary clipping characteristic or a clipping characteristic with good linearity can be obtained as described above. In addition, the invention does not require any special diode for the above purpose and is simple in circuit construction. Therefore, the circuit of the invention can be easily made as an integrated circuit.

Figure 5:
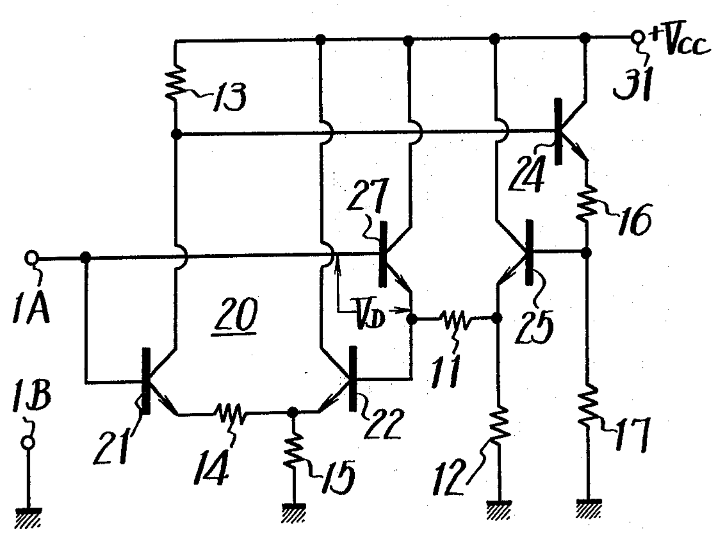
FIG. 5 is a circuit diagram showing another embodiment of clipper circuits according to the present invention.

FIG. 5 is a connection diagram showing another embodiment of the invention. That is, in the embodiment of FIG. 5, in place of the diode 10 used in the embodiment of FIG. 4, a transistor 27 of emitter-follower configuration is employed and its base-emitter junction is used for clipping with the same operation and effect as in the case of FIG. 4. Since the operation of the circuit shown in FIG. 5 will be easily understood from that of the description given in connection with the circuit shown in FIG. 4, it will be omitted for the sake of simplicity.

It may be apparent that many variations and modifications could be effected by those skilled in the art without departing from the spirits or scope of the novel concepts of the invention.

We claim as our invention:

1. A circuit for clipping a signal comprising:

a. a pair of input terminals to be supplied with an input signal therebetween;

b. a P-N junction device connected to one of said pair of input terminals at its one end so that the input signal is applied to a P-N junction thereof;

c. a resistor connected to the other end of said P-N junction device at its one end;

d. voltage supplying means connected between the other end of said resistor and the other of said pair of input terminals for supplying a bias voltage to said P-N junction to determine a conductive voltage level thereof:

e. detecting means for detecting a voltage across the P-N junction of said P-N junction device and controlling the value of said bias voltage supplied to said P-N junction device in response to the detected voltage; and f. means for deriving an output signal from said resistor.

2. A circuit according to claim 1, wherein said voltage supplying means comprises first means for producing a constant voltage and second means for producing a variable voltage in addition to said constant voltage, said second means being controlled by said detecting means so that said variable voltage is proportional to the voltage across said P-N junction.

3. A circuit according to claim 2, wherein said second means produces a voltage equal to the voltage across said P-N junction as said variable voltage.

4. A circuit according to claim 2, wherein said P-N junction device comprises a diode connected between said one of the pair of input terminal and said one end of said resistor.

5. A circuit according to claim 2, wherein said P-N junction device comprises a transistor with a base-emitter junction connected between said one of the pair of input terminal and said one end of said resistor.

6. A circuit according to claim 2, wherein said detecting means comprises a differential amplifier with a pair of inputs connected to both ends of said P-N junction device respectively, and an output connected to said voltage supplying means.

7. A circuit according to claim 6, wherein said voltage supplying means comprises a first additional transistor with a collector connected to a voltage source and a emitter connected to the other of said pair of input terminals through a first additional resistor, the connecting point between said emitter and said first additional resistor being connected to said other end of said resistor, and a second additional transistor with a collector connected to said voltage source, an emitter connected to a base of said first additional transistor and a base connected to the output of said differential amplifier.

* * * * *